United States Patent
Chen et al.

(10) Patent No.: US 11,557,583 B2
(45) Date of Patent: Jan. 17, 2023

(54) CELL ARCHITECTURE

(71) Applicant: Arm Limited, Cambridge (GB)

(72) Inventors: Andy Wangkun Chen, Austin, TX (US); Sriram Thyagarajan, Austin, TX (US); Yew Keong Chong, Austin, TX (US); Sony, Noida (IN)

(73) Assignee: Arm Limited, Cambridge (GB)

( * ) Notice: Subject to any disclaimer, the term of this patent is extended or adjusted under 35 U.S.C. 154(b) by 313 days.

(21) Appl. No.: 17/017,551

(22) Filed: Sep. 10, 2020

(65) Prior Publication Data

US 2022/0077134 A1 Mar. 10, 2022

(51) Int. Cl.
*H01L 27/02* (2006.01)
*H01L 27/092* (2006.01)
*G06F 30/3953* (2020.01)
*G06F 30/392* (2020.01)
*H01L 23/48* (2006.01)

(52) U.S. Cl.
CPC ........ *H01L 27/0207* (2013.01); *G06F 30/392* (2020.01); *G06F 30/3953* (2020.01); *H01L 23/481* (2013.01); *H01L 27/092* (2013.01)

(58) Field of Classification Search
USPC ........................................................ 257/288
IPC ............... H01L 27/0207,23/481, 27/092; G06F 30/392, 30/3953
See application file for complete search history.

(56) References Cited

U.S. PATENT DOCUMENTS

| | | | |
|---|---|---|---|
| 10,950,546 B1* | 3/2021 | Doornbos | H01L 21/76897 |
| 11,200,961 B1* | 12/2021 | Uribe | G11C 29/44 |
| 2015/0121052 A1* | 4/2015 | Emma | G06F 11/3452 |
| | | | 713/1 |
| 2015/0347665 A1* | 12/2015 | Sapatnekar | G06F 30/394 |
| | | | 716/115 |
| 2017/0235865 A1* | 8/2017 | Preuthen | H01L 21/84 |
| | | | 716/119 |
| 2018/0013432 A1* | 1/2018 | Klass | G06F 1/3296 |
| 2021/0225830 A1* | 7/2021 | Liu | H01L 27/0207 |
| 2022/0084561 A1* | 3/2022 | Chen | G11C 5/14 |
| 2022/0147679 A1* | 5/2022 | Edathil | G06F 30/394 |
| 2022/0188496 A1* | 6/2022 | Edathil | G06F 30/398 |

* cited by examiner

*Primary Examiner* — Hrayr A Sayadian
(74) *Attorney, Agent, or Firm* — Pramudji Law Group PLLC; Ari Pramudji (57) ABSTRACT

Various implementations described herein refer to a device having logic circuitry with transistors and gate lines. The device may include a backside power network having buried supply rails with at least one buried supply rail having a continuity break. The transistors may be arranged in a cell architecture having an N-well break with the gate lines passing through the N-well break and the continuity break.

20 Claims, 5 Drawing Sheets

CELL ARCHITECTURE

BACKGROUND

This section is intended to provide information relevant to understanding the various technologies described herein. As the section's title implies, this is a discussion of related art that should in no way imply that it is prior art. Generally, the related art may or may not be considered prior art. It should therefore be understood that any statement in this section should be read in this light, and not as any admission of prior art.

In some memory architecture designs, conventional power rails can be buried in memory, wherein metal power lines can be buried in the substrate, and these lines can be used as power rails for voltage distribution from backside circuitry. However, in these conventional memory designs, memory cells typically use frontside power rails for voltage distribution to frontside circuitry including the memory cells. Unfortunately, conventional memory designs are inefficient in that use of frontside power rails for memory cells suffers from area penalty in fabrication. Therefore, there exists a need to improve conventional memory designs to improve area efficiency of modern memory architecture.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are related to a cell architecture with buried power rails for backside power distribution in memory applications. For instance, various schemes and techniques described herein may provide for a power distribution architecture that operates to provide a backside power distribution network for memory applications. In some instances, various schemes and techniques described herein may provide for buried backside power rails that supply core voltage (VDD) and ground (VSS) to memory circuitry. Thus, in some implementations, various backside power distribution schemes and techniques described herein may provide a device having logic circuitry with transistors with gate lines, and the device may include a backside power network having buried supply rails with at least one buried supply rail having a continuity break. Also, the transistors may be arranged in a cell architecture having an N-well break with the gate lines passing through the N-well break and the continuity break. In other implementations, the various backside power distribution schemes and techniques described herein may provide a cell architecture with multiple regions including a first region with an N-well and a second region with an N-well break. The cell architecture may also include transistors having a first column of transistors in the first region with the N-well and a second column of transistors in the second region with the N-well break.

In some implementations, the various backside power distribution schemes and techniques described herein may provide for random access memory (RAM) applications including static RAM (SRAM). Therefore, various implementations described herein may provide for a novel cell architecture that utilizes buried metal for critical signals in SRAM applications. In reference to backside power domains for SRAM technology, metallization may be provided frontside (e.g., above a device) and also backside (e.g., below a device) as buried power rails. In the logic domain, the buried power rails may be used to supply power to memory components in a core array such that power domains are used to avoid area penalty. Various implementations described herein may also provide for an overall power domain scheme for memory applications, including, e.g., various use of backside-to-frontside transition cells having transition vias. These aspects along with various other features and characteristics are described in greater detail herein.

Various implementations of cell architecture having backside power rails along with various backside power distribution schemes and techniques related thereto will be described in greater detail herein with reference to FIGS. 1-3.

Figure 1:
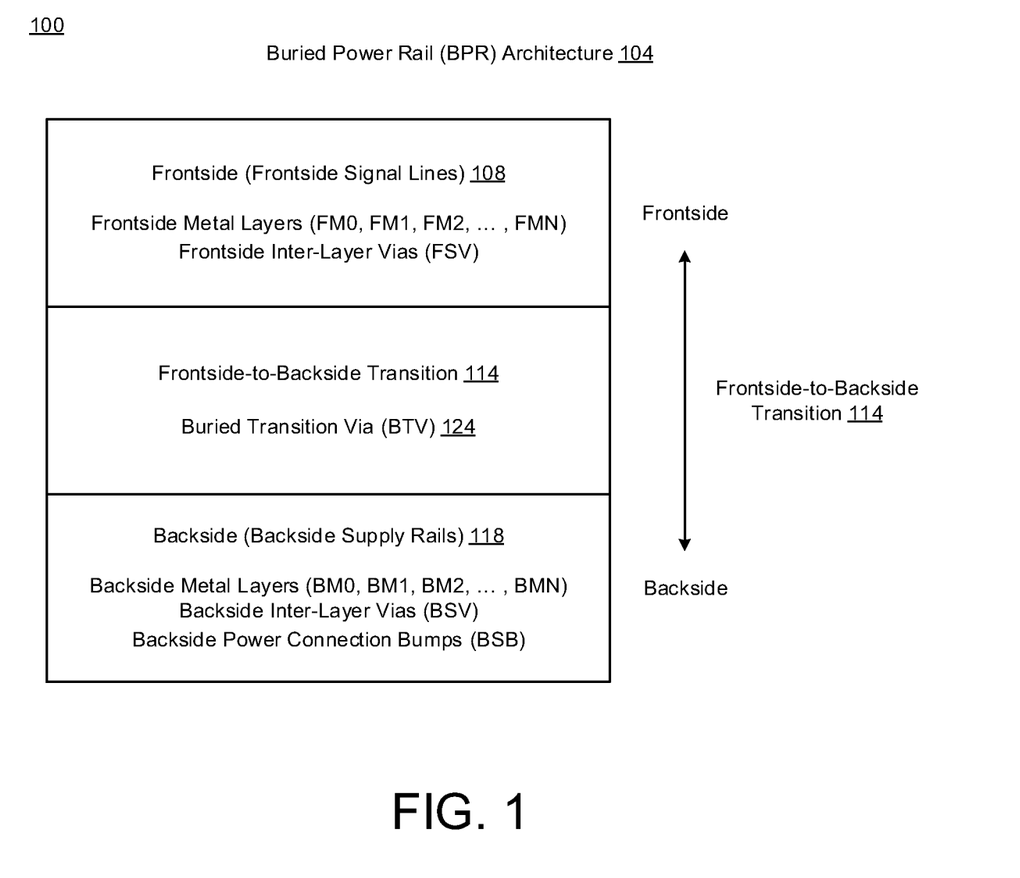
FIG. 1 illustrates a schematic diagram of buried power rail (BPR) architecture in accordance with various implementations described herein.

FIG. 1 illustrates a diagram 100 of buried power rail (BPR) architecture 104 in accordance with various implementations described herein.

In various implementations, the BPR architecture 104 may be implemented as a system or a device having various integrated circuit (IC) components that are arranged and coupled together as an assemblage or combination of parts that provide for a physical circuit design and related structures. In some instances, a method of designing, providing and building the BPR architecture 104 as an integrated system or device may involve use of various IC circuit components described herein to thereby implement various backside power distribution schemes and techniques associated therewith. The BPR architecture 104 may be integrated with computing circuitry and related components on a single chip, and the BPR architecture 104 may also be implemented in some embedded systems for automotive, electronic, mobile, server and Internet-of-things (IoT) applications.

As shown in FIG. 1, the BPR architecture 104 may include a frontside network 108 with frontside signal lines that are configured for memory circuitry. In some instances, the frontside network 108 may have various types of components, circuitry, and/or metal layers. For instance, the frontside network 108 may include frontside supply rails that are coupled to memory circuitry having, e.g., an array of bitcells that are arranged in columns and rows along with header logic and control logic. Also, the frontside network 108 may also include a number (N) of frontside metal layers (e.g., FM0, FM1, FM2, . . . , FMN) along with frontside inter-layer vias (FSV).

Also, the BPR architecture 104 may include a backside power network 118 that provides power distribution for various components and/or circuits of the memory circuitry, such as, e.g., bitcell array, column multiplexer circuits (COLMUX), sense amplifier circuits (SA), powergate input/output (PG I/O) circuits, and powergate control (PG_CNTL). The backside power network 118 may be configured to provide power in one or more voltage domains (e.g., VDD, VSS) for memory circuitry that is disposed frontside. The backside power network 118 may supply core voltages, periphery voltages and/or ground.

In some implementations, the backside power network 118 may include one or more backside supply rails that are formed with buried metal layers. Thus, the backside power network 118 may have backside metal layers (e.g., BM0, BM1, BM2, . . . , BMN) along with backside inter-layer vias (BSV). The backside power network 118 may also include backside power connection bumps (BSB).

The BPR architecture 104 may also include a backside-to-frontside transition 114 having buried transition vias (BTV) that may be used for coupling the buried backside metal to the frontside metal. The buried transition vias (BTV) 124 may provide a power transition between the backside power network 118 to the frontside network 108. Thus, in some implementations, the BPR architecture 104 may be configured to transition the backside power rails of the backside power network to the frontside so as to provide power taps to the memory circuitry from the backside power network. The backside-to-frontside transition 114 may be referred to as buried transition architecture that may have backside-to-frontside transition cells with the buried transition vias 124 for a transition between the backside power network 118 and the frontside network 108.

In some implementations, the backside power rail (BPR) architecture 104 may refer to a cell architecture operating as a power distribution network that utilizes backside buried metal in the backside power network for the backside power rails and also uses frontside metal of the frontside network for the memory circuitry. The frontside network utilizes frontside metal, and the backside power network utilizes backside buried metal disposed underneath the frontside metal of the frontside network. Also, the transition architecture may use the buried transition vias coupled between the backside buried metal of the backside power network and the frontside metal of the frontside network.

Figure 2A:
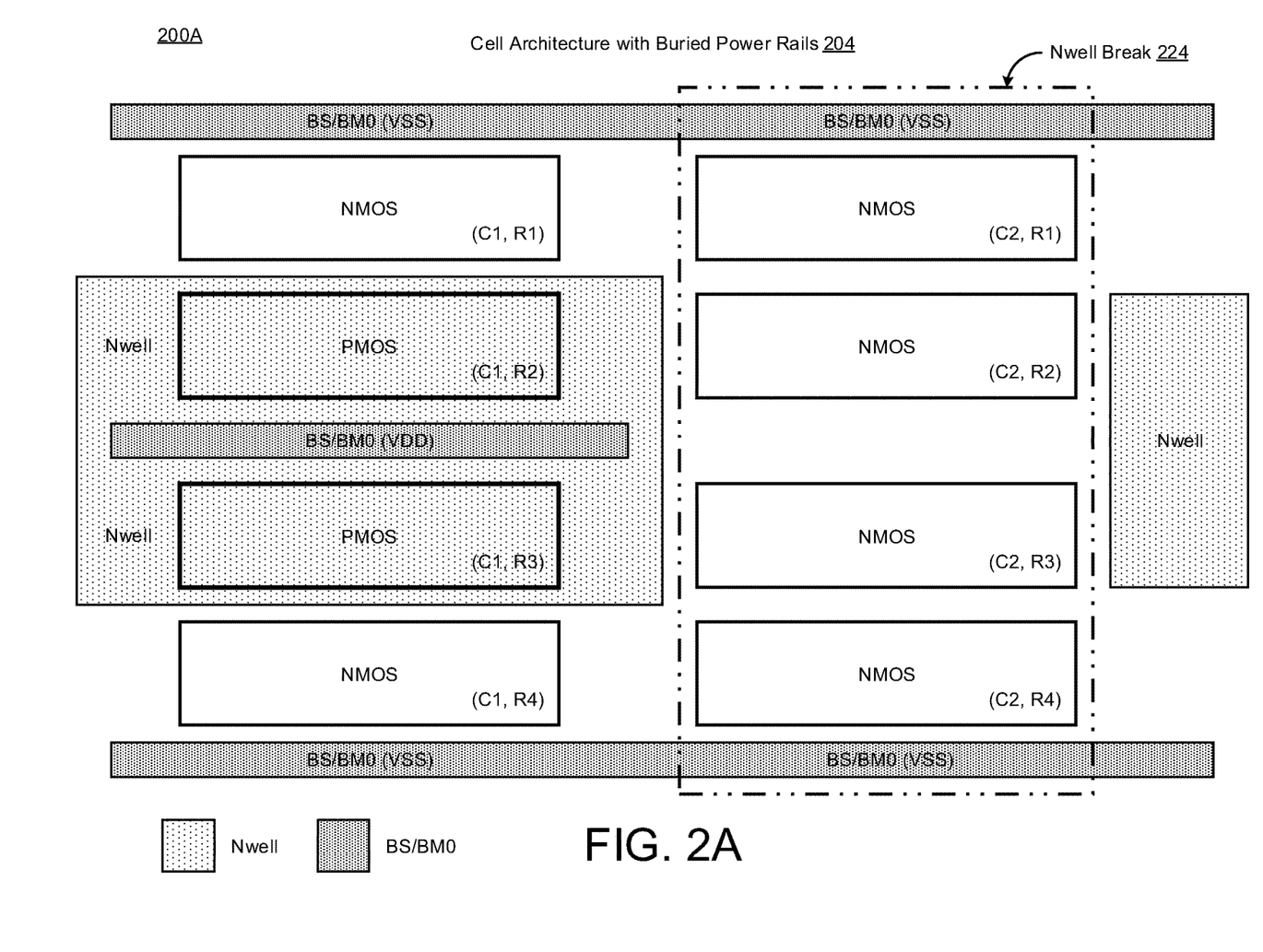
FIGS. 2A-2C illustrates diagrams of cell architecture with buried power rails (BPR) in accordance with various implementations described herein.
Figure 2B:
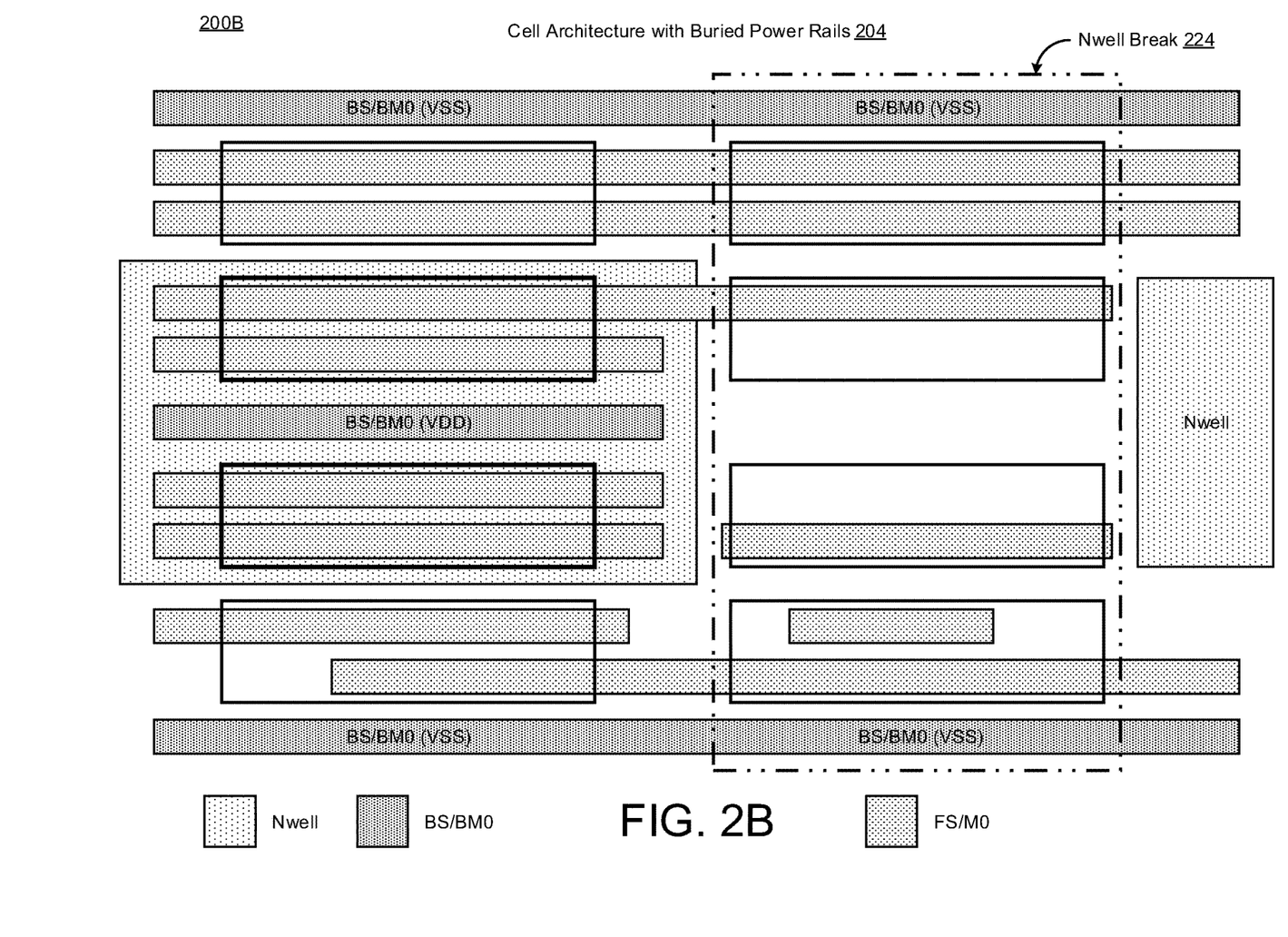
Figure 2C:
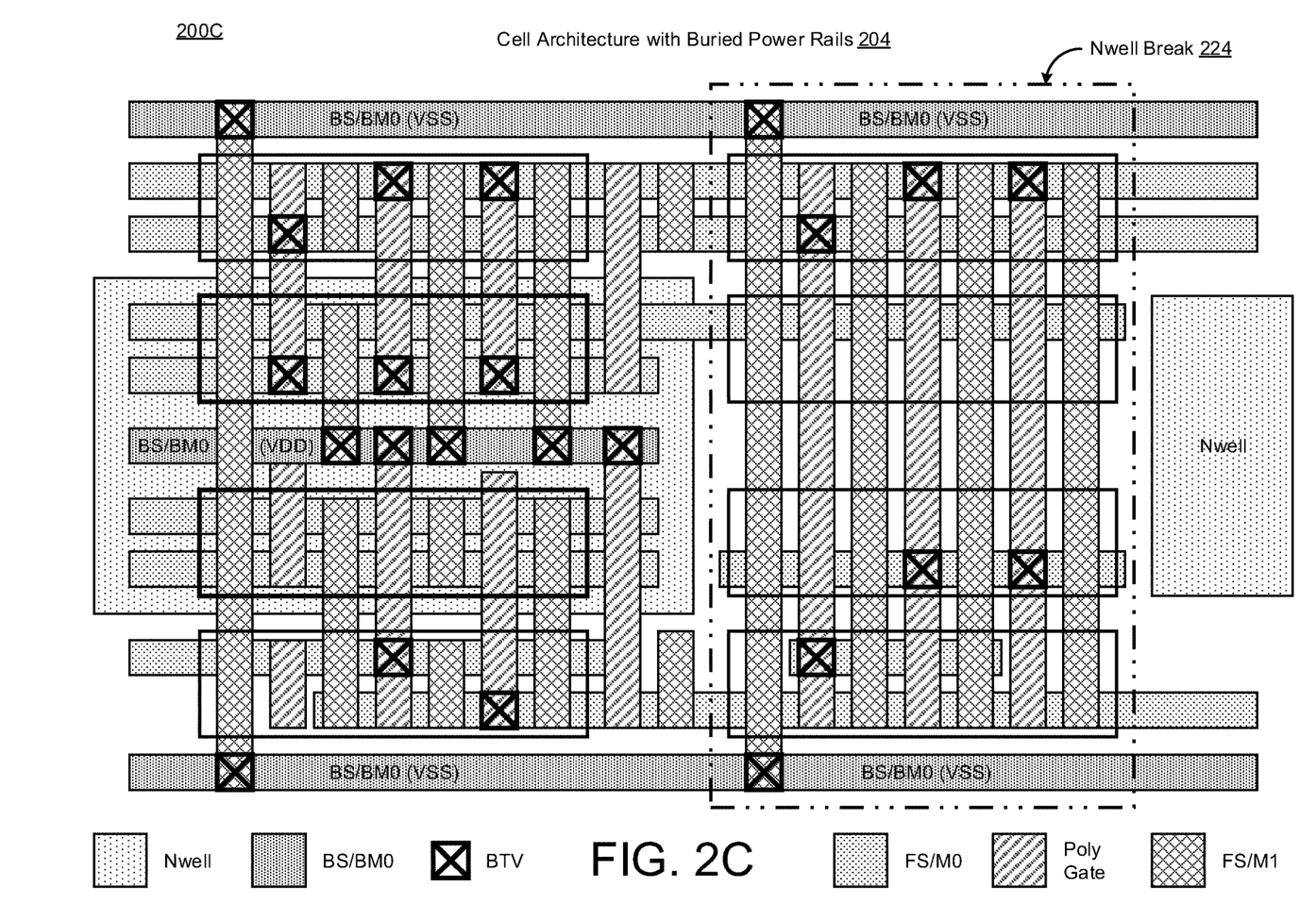

FIGS. 2A-2C illustrate various diagrams of cell architecture 204 with buried power rails (BS/BM0) in accordance with implementations described herein. In particular, FIG. 2A shows a first diagram 200A of the cell architecture 204 with transistors (NMOS, PMOS) and the buried power rails (BS/BM0). FIG. 2B shows a second diagram 200B of the cell architecture 204 with the transistors (NMOS, PMOS), the buried power rails (BS/BM0), and frontside metals (FS/M0). Also, FIG. 2C shows a third diagram 200C of the cell architecture 204 with transistors (NMOS, PMOS), buried power rails (BS/BM0), frontside metals (FS/M0, FS/M1), and vertically aligned poly gate lines.

In various implementations, the cell architecture 204 may be implemented as a system or a device having various integrated circuit (IC) components that are arranged and coupled together as an assemblage or combination of parts that provide for a physical circuit design and related structures. In some instances, a method of designing, providing and building the cell architecture 204 as an integrated system or device may involve use of various IC circuit components described herein to thereby implement various backside power distribution schemes and techniques associated therewith. The cell architecture 204 may be integrated with computing circuitry and related components on a single chip, and the cell architecture 204 may also be implemented in some embedded systems for automotive, electronic, mobile, server and Internet-of-things (IoT) applications.

As shown in FIGS. 2A-2C, the cell architecture 204 may include logic circuitry having the transistors (NMOS, PMOS) with gate lines, such as, e.g., vertically aligned poly gates lines in FIG. 2C. Also, in FIGS. 2A-2C, the cell architecture 204 may include a backside power network with the buried supply rails (BS/BM0), wherein at least one of the buried supply rails (BS/BM0/VDD) has a continuity break corresponding to a region of the cell architecture 204 with the N-well break. Also, in FIGS. 2A-2C, the transistors (NMOS, PMOS) may be arranged in a first column (C1) without the N-well break and in a second column (C2) with the N-well break 224. Also, as shown in FIG. 2C, the poly gate lines may pass through the N-well break 224 and the continuity break of the VDD line.

In reference to FIGS. 2A-2C, the cell architecture 204 may include frontside signal lines (FS/M0) coupled to the transistors (NMOS, PMOS) for signal routing, and the cell architecture 204 may include buried transition vias (BTV) that couple the transistors to the buried supply rails (BS/BM0) in the backside power network. The frontside signal lines may be formed with frontside metal, and the buried supply rails (BS/BM0) may be formed with backside buried metal. In some instances, the backside buried metal may be disposed underneath the frontside metal, and the buried transition vias (BTV) may be disposed between the frontside metal and the backside buried metal. The buried supply rails (BS/BM0) provide a backside power network to the transistors (NMOS, PMOS) in the cell architecture 204, and the buried transition vias (BTV) may be used to transition the backside power network to the transistors (NMOS, PMOS) in the logic circuitry. Further, the backside power network is configured to provide a core voltage (VDD) and ground (VSS) to the transistors (NMOS, PMOS) in the logic circuitry.

In reference to FIG. 2A, the transistors (NMOS, PMOS) may be arranged in a first column of transistors (C1) and a second column of transistors (C2). The first column of transistors (C1) may be arranged in multiple rows (R1, R2, R3, R4), and the second column of transistors (C2) may be arranged in the multiple rows (R1, R2, R3, R4) adjacent to the first column of transistors (C1). The first column of transistors (C1) may have a first number of N-type transistors (NMOS) and a second number of P-type transistors (PMOS), and the second column of transistors (C2) may have a third number of N-type transistors (NMOS) that is greater than the first number of N-type transistors (NMOS). For instance, the first number of transistors may refer to multiple N-type transistors, the second number of transistors may refer to multiple P-type transistors, and the third number of transistors may refer to multiple N-type transistors that is at least greater than the first number of N-type transistors. In some cases, the first number of NMOS transistors in the first column (C1) may refer to two (2) NMOS transistors, and the second number of PMOS transistors in the first column (C1) may refer to two (2) PMOS transistors. Also, in this case, the third number of NMOS transistors in the second column (C2) may refer to more than two (2) NMOS transistors, such as, e.g., four (4) NMOS transistors, and in this case, the number of PMOS transistors in the second column (C2) may be zero (0). Thus, the N-well break 224 in reference to the second column (C2) may allow for the deposition of more NMOS transistors than the first column (C1).

In reference to FIG. 2B, the cell architecture 204 may have an active diffusion region, and the cell architecture 204 may include the N-well region having an open spatial interval (i.e., a continuity break) that provides the N-well break 224 so as to allow the poly gate lines to pass through the N-well break 224. In some instances, in reference to FIG. 2C, the poly gate lines refer to poly-silicon gate lines that are substantially perpendicular with the buried supply rails (BS/BM0). Also, the poly-silicon gate lines may be disposed in a manner so as to pass through the open spatial interval of the N-well break 224. Also, the frontside metal may provide additional conductive lines (FS/M1) that are substantially perpendicular to the buried supply rails (BS/BM0), and the conductive lines (FS/M1) may be disposed between the buried supply rails (BS/BM0) in a manner so as to be coupled to the transistors (NMOS, PMOS). Therefore, the frontside network may provide a first conductive line (FS/M0) and a second conductive line (FS/M1).

Therefore, as shown in reference to FIGS. 2A-2C, various implementations described herein may provide a cell architecture having multiple regions including a first region with an N-well and a second region with an N-well break. Also, the cell architecture may provide transistors including a first column of transistors in the first region with the N-well and a second column of transistors in the second region with the N-well break. The first column of transistors may include a first number of N-type transistors and a second number of P-type transistors, and the second column of transistors include a third number of N-type transistors that is greater than the first number of N-type transistors. The first column of transistors may be coupled to buried supply rails of the backside power network, and the second column of transistors may be disposed between and coupled to the buried supply rails of the backside power network through the N-well break, and also, the second column of transistors may include gate lines that pass through the N-well break. The cell architecture may have an N-well region with an open spatial interval that provides the N-well break so as to allow the gate lines to pass through the N-well break. The gate lines may refer to poly-silicon gate lines that are substantially perpendicular to the buried supply rails, and the poly-silicon gate lines may be disposed in a manner so as to pass through the open spatial interval of the N-well break.

Figure 3:
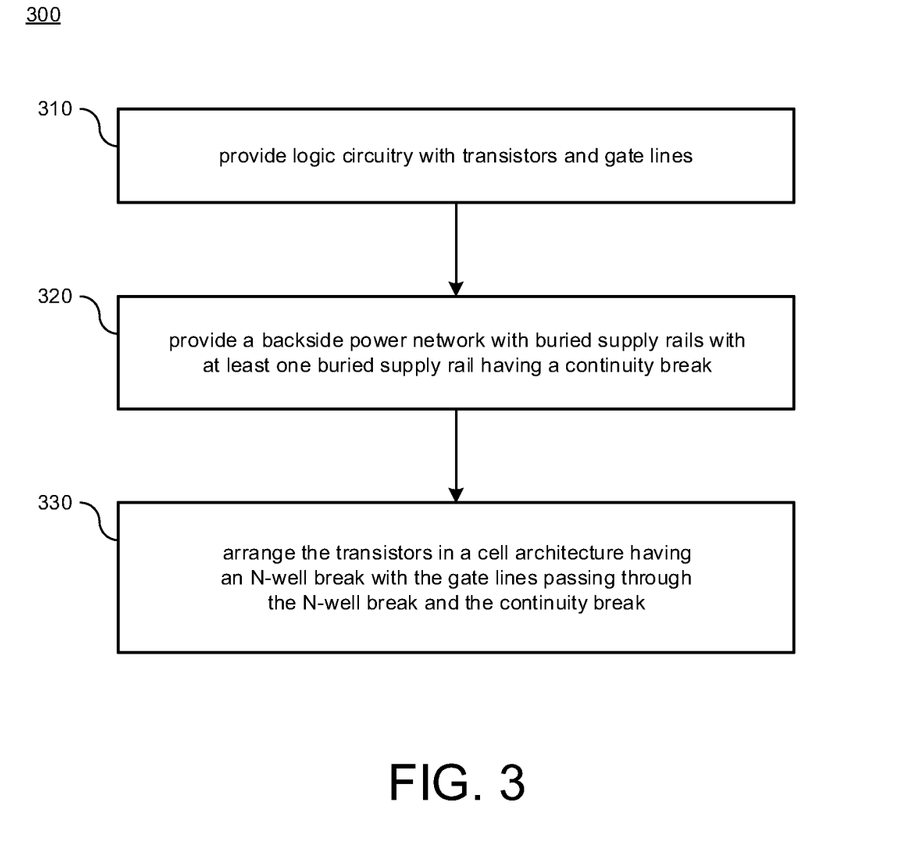
FIG. 3 illustrates a diagram of a method for providing buried power rail (BPR) architecture in accordance with implementations described herein.

FIG. 3 illustrates a process flow diagram of a method 300 for providing buried power rail (BPR) architecture in accordance with implementations described herein.

It should be understood that even though the method 300 indicates a particular order of operation execution, in some cases, various particular portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various components and/or circuitry, as described herein in reference to FIGS. 1 and 2A-2C. Also, if implemented in software, method 300 may be implemented as a program and/or software instruction process that provides for various backside power distribution schemes and techniques, as described herein. Also, if implemented in software, various instructions related to implementing method 300 may be stored in memory and/or a database. For instance, various types of computing devices having a processor and memory may be configured to perform method 300.

In various implementations, the method 300 may refer to a method of designing, providing, building, fabricating and/or manufacturing cell architecture with backside power rail as an integrated system, device and/or circuit that may involve use of the various IC circuit components described herein to thereby implement the backside power distribution schemes and techniques associated therewith. Also, in various implementations, the cell architecture with backside power rails may be integrated with various computing circuitry and other related components on a single chip, and the cell architecture with backside power rails may be implemented in various embedded systems for automotive, electronic, mobile, server and Internet-of-things (IoT) applications.

At block 310, method 300 may provide logic circuitry with transistors and gate lines. In some implementations, the transistors may include a first column of transistors that are arranged in multiple rows, and also, the first column of transistors may include a first number of N-type transistors (e.g., NMOS) and a second number of P-type transistors (e.g., PMOS). In some implementations, the transistors may include a second column of transistors that are arranged in multiple rows adjacent to the first column of transistors, and the second column of transistors may include a third number of N-type transistors that is greater than the first number of N-type transistors. In some implementations, the first number of N-type transistors may be two (2), the second number of P-type transistors may be two (2), and the third number of N-type transistors may be more than two (>2), such as, e.g., four (4). Various other configurations may be used.

At block 320, method 300 may provide a backside power network (BSPN) with buried supply rails, wherein at least one buried supply rail has a continuity break. In some implementations, method 300 may provide frontside signal lines that are coupled to the transistors for signal routing, and also, method 300 may provide buried transition vias that couple the transistors to the buried supply rails.

At block 330, method 300 may arrange the transistors in a cell architecture that has an N-well break with the gate lines passing through the N-well break and the continuity break. In various implementations, the gate lines may refer to poly-silicon gate lines, and also, the poly-silicon gate lines may be disposed in a manner so as to pass through an open spatial interval formed with the N-well break.

Various implementations described herein are related to a cell architecture with buried power rails for backside power distribution in memory applications. For instance, various schemes and techniques described herein may provide for a device having logic circuitry with transistors and gate lines, and also, the device may have a backside power network with buried supply rails, wherein at least one buried supply rail has a continuity break. Also, the transistors may be arranged in a cell architecture having an N-well break with the gate lines passing through the N-well break and/or the continuity break. In other instances, the various schemes and techniques described herein may provide for a cell architecture having multiple regions including a first region with an N-well and a second region with an N-well break. The cell architecture may have transistors including a first column of transistors in the first region with the N-well and a second column of transistors in the second region with the N-well break. The first column of transistors may include a first number of N-type transistors (e.g., NMOS) and a second number of P-type transistors (e.g., PMOS), and the second column of transistors may include a third number of N-type transistors that is greater than the first number of N-type transistors. The cell architecture may include a backside power network having buried supply rails with at least one buried supply rail having a continuity break in the second region with the N-well break, and the second column of transistors may be disposed in the second region with the N-well break and the continuity break. Also, the first column of transistors have first gate lines, and the second column of transistors may have second gate lines that pass through the N-well break and the continuity break in the at least one buried supply rail.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device includes logic circuitry having transistors with gate lines. The device may include a backside power network having buried supply rails with at least one buried supply rail having a continuity break. The transistors may be arranged in a cell architecture having an N-well break with the gate lines passing through the N-well break and the continuity break.

Described herein are various implementations of a cell architecture. The cell architecture may have multiple regions including a first region with an N-well and a second region with an N-well break. The cell architecture may have transistors including a first column of transistors in the first region with the N-well and a second column of transistors in the second region with the N-well break.

Described herein are various implementations of a method. The method may include providing logic circuitry with transistors and gate lines. The method may include providing a backside power network with buried supply rails with at least one buried supply rail having a continuity break. The method may include arranging the transistors in a cell architecture having an N-well break with the gate lines passing through the N-well break and the continuity break.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing refers to implementations of various techniques described herein, various other and further implementations may be devised in accordance with the disclosure herein, which may be determined by the claims that follow.

Although the subject matter has been described in language that is specific to various structural features and/or methodological acts, it is to be understood that subject matter defined in the appended claims is not necessarily limited to the specific features or acts described above. Rather, specific features and acts described above are disclosed as example forms of implementing the claims.

What is claimed is:

1. A device, comprising:
   logic circuitry having transistors with gate lines; and
   a backside power network having buried supply rails with at least one buried supply rail having a continuity break,
   wherein the transistors are arranged in a cell architecture having an N-well break with the gate lines passing through the N-well break and the continuity break.

2. The device of claim 1, wherein the transistors include:
   a first column of transistors that are arranged in multiple rows, and
   a second column of transistors that are arranged in multiple rows adjacent to the first column of transistors.

3. The device of claim 2, wherein:
   the first column of transistors includes a first number of transistors and a second number of transistors, and
   the second column of transistors includes a third number of transistors that is greater than the first number of transistors.

4. The device of claim 3, wherein:
   the first number of transistors refers to multiple N-type transistors,
   the second number of transistors refers to multiple P-type transistors, and
   the third number of transistors refers to multiple N-type transistors that is greater than the first number of N-type transistors.

5. The device of claim 1, wherein the gate lines refer to poly-silicon gate lines.

6. The device of claim 1, further comprising:
frontside signal lines coupled to the transistors for signal routing; and
buried transition vias that couple the transistors to the buried supply rails.

7. The device of claim 6, wherein:
the frontside signal lines are formed with frontside metal, and
the buried supply rails are formed with backside buried metal.

8. The device of claim 7, wherein:
the backside buried metal is disposed underneath the frontside metal, and
the buried transition vias are disposed between the frontside metal and the backside buried metal.

9. The device of claim 6, wherein:
the buried supply rails provide a backside power network to the transistors in the cell architecture, and
the buried transition vias are used to transition the backside power network to the transistors in the logic circuitry.

10. The device of claim 1, wherein the backside power network is configured to provide a core voltage (VDD) and ground (VSS) to the transistors in the logic circuitry.

11. A cell architecture, comprising:
multiple regions including a first region with an N-well and a second region with an N-well break; and
transistors including a first column of transistors in the first region with the N-well and a second column of transistors in the second region with the N-well break.

12. The cell architecture of claim 11, wherein:
the first column of transistors include a first number of N-type transistors and a second number of P-type transistors, and
the second column of transistors include a third number of N-type transistors that is greater than the first number of N-type transistors.

13. The cell architecture of claim 11, further comprising:
a backside power network having buried supply rails with at least one buried supply rail having a continuity break in the second region with the N-well break,
wherein the second column of transistors are disposed in the second region with the N-well break and the continuity break.

14. The cell architecture of claim 13, wherein:
the first column of transistors have first gate lines, and
the second column of transistors have second gate lines that pass through the N-well break and the continuity break in the at least one buried supply rail.

15. The cell architecture of claim 14, wherein:
the first gate lines and the second gate lines refer to poly-silicon gate lines, and
the second gate lines are disposed in a manner so as to pass through an open spatial interval formed with the N-well break.

16. A method, comprising:
providing logic circuitry with transistors and gate lines; and
providing a backside power network with buried supply rails with at least one buried supply rail having a continuity break,
arranging the transistors in a cell architecture having an N-well break with the gate lines passing through the N-well break and the continuity break.

17. The method of claim 16, wherein the transistors include:
a first column of transistors that are arranged in multiple rows, and the first column of transistors has a first number of transistors and a second number of transistors, and
a second column of transistors that are arranged in multiple rows adjacent to the first column of transistors, and the second column of transistors has a third number of transistors that is greater than the first number of transistors.

18. The method of claim 17, wherein:
the first number of transistors refers to multiple N-type transistors,
the second number of transistors refers to multiple P-type transistors, and
the third number of transistors refers to multiple N-type transistors that is greater than the first number of N-type transistors.

19. The method of claim 16, further comprising:
providing frontside signal lines coupled to the transistors for signal routing; and
providing buried transition vias that couple the transistors to the buried supply rails.

20. The method of claim 16, wherein the gate lines refer to poly-silicon gate lines.

* * * * *